United States Patent
Revol Cavalier et al.

(10) Patent No.: US 8,257,792 B2
(45) Date of Patent: Sep. 4, 2012

(54) PROCESS FOR DEPOSITING SENSORS ON A POROUS SUPPORT

(75) Inventors: Frederic Revol Cavalier, Seyssins (FR);
Nadine David, La Murette (FR);
Sebastien Schoumacker, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 266 days.

(21) Appl. No.: 12/487,880

(22) Filed: Jun. 19, 2009

(65) Prior Publication Data
US 2010/0021637 A1 Jan. 28, 2010

(30) Foreign Application Priority Data
Jun. 20, 2008 (FR) ...................................... 08 03456

(51) Int. Cl.
*B05D 1/18* (2006.01)
*B05D 1/32* (2006.01)
(52) U.S. Cl. ...... 427/261; 427/265; 427/288; 427/430.1
(58) Field of Classification Search .................. 427/261, 427/265, 288, 430.1
See application file for complete search history.

(56) References Cited

U.S. PATENT DOCUMENTS
6,737,114 B2 * 5/2004 Dawson et al. ................ 427/282
7,578,195 B2 * 8/2009 DeAngelis et al. ............. 73/718

FOREIGN PATENT DOCUMENTS
DE 10 2005 062 028 A1 6/2007
EP 1 291 463 A1 3/2003

OTHER PUBLICATIONS

Emmanuel Gasana et al., "Electroconductive Textile Structures through Electroless Deposition of Polypyrrole and Copper at Polyaramide Surfaces", Surface & Coatings Technology, vol. 201, No. 6, Nov. 17, 2006, pp. 3547-3551.

* cited by examiner

*Primary Examiner* — Frederick Parker
(74) *Attorney, Agent, or Firm* — Oblon, Spivak, McClelland, Maier & Neustadt, L.L.P.

(57) ABSTRACT

Process for manufacturing an article comprising an approximately flat porous support and, within this support, defined zones in a chosen pattern, these zones being grafted with sensor molecules, such as metals, biological molecules, whereas the rest of the support remains free of this grafting.

12 Claims, 3 Drawing Sheets

PROCESS FOR DEPOSITING SENSORS ON A POROUS SUPPORT

BACKGROUND

1. Technological Field

The subject of the invention is a novel process for depositing sensors, such as metals, biological molecules, on a porous support in a chosen pattern.

2. Description of the Related Art

The textile industry is seeking to develop what are called "smart" fabrics which make it possible, apart from the usual functions of textiles, to provide the fabric with additional functionalities. In certain projects deodorants or medicaments are incorporated into a fabric so as to diffuse over the course of time. In the clothing market, there are technical garments that include novel functionalities. For example, the company Mulliez has proposed garments for fixing odors, such as frying or perspiration odors. Other garments from the same company contain mosquito-repellant products intended in particular to prevent malaria. Other companies such as DIM or Triumph have proposed slimming or hydrating pantyhose based on capsules concealed between the fibers of the panty-hose.

Other developments relate to the implantation of electronic components in a garment, for example for cardiac monitoring. The practice of having the elderly remain in their own homes for as long as possible has inspired the development of sensors integrated into garments so as to monitor the physiological parameters of those persons to be monitored. Mention may also be made of an FM radio connected to the garment. Safety equipment or military suits are increasingly being equipped with sensors that measure the external environment (contamination, radioactivity) but also the physiological data of the person wearing the garment (heartbeat, temperature, stress, GPS positioning, etc.). Electrical or electrochemical sensors allow various physiological parameters to measured, such as for example the ionic conductivity of the patient's sweat, which may provide information about the latter's dehydration. Measurement of brain activity may be monitored by measuring the electrical activity of neurons (electroencephalogram). Temperature may be monitored by an electrical measurement, while pH may also be checked by electrochemical measurements. Monitoring of active medical treatments by reading biological responses via specific sensors may also be mentioned.

All these sensors require the use of metal electrodes for taking the measurement. The current approach consists in developing sensors and then attaching them to the garment by bonding, stitching or weaving. The sensors are therefore not integrated into the fabric, but attached thereto. The sensors are produced separately and then stitched or bonded to the garment and connected to the electronics integrated into the garment by electrical wires passed through the lining. This procedure represents an additional step in the production of the clothing article, and usually this step cannot be automated. It therefore represents an additional cost in the manufacture of the article. One way of improving this manufacturing process would consist in developing the sensor directly during manufacture of the fabric so as to push its integration to the maximum.

This requires precise definition of zones on a fabric for depositing thereon the materials or components intended to be integrated into the fabric. In particular, it is necessary beforehand to define not only the position of the sensor, but also its shape and size. If it is desired to be able to compare data delivered by various sensors, it is necessary to be able to determine the precise area of the sensor that will collect information. If it is desired to deliver a medicament, the area of exchange between the medicament-containing fabric and the skin must be able to be known precisely. The location of the components integrated into the garment and the area occupied by a sensor constitute elements of paramount importance in controlling the measurements made on a garment.

It is therefore necessary to be able to delimit zones in the fabric that will be dedicated to metallization or dedicated to the grafting, for example, of chemical or biological sensors.

Attempts have also been made to develop a process which overall simplifies garment manufacture in the case of garments that include electronic sensors, for example, by simultaneously creating the sensors and the contact mounting thereof. This avoids having to place connectors between the sensors and the electrical wires.

Hitherto, various methods have been employed for depositing metals on a porous material (fabric, paper, woven structure)—metal wires may be woven or stitched into the material during its manufacture. This technique is tricky as pure metals are generally ductile and brittle, and fabric manufacturing techniques are not always compatible for putting these metal wires in place. The cost of metal wires is high. The areas produced are generally of small size (less than 1 $cm^2$).

Pure metals may be deposited in a sputterer or an evaporator through a mechanical mask. The fabric must then be able to be placed in a vacuum machine, and the cost of this operation is high. In addition, these physical deposition (evaporation, sputtering) techniques enable metal to be deposited only on the surface of the support. This is a major drawback during use of the support (for example washing or rubbing of the fabric). The material deposited risks being damaged and the resistivity of the sensor modified.

A third technique consists in using a printer, enabling a metallic ink to be deposited on the fabric at the chosen places. This technique allows pure metals to be deposited by chemical means, but requires the use of a printer. This technique can be envisioned if only a few patterns have to be manufactured, but as soon as it is desired to print several different patterns, this approach becomes time-consuming. In addition, the conductive ink spreads differently depending on the type of fabric in question. Since the hydrophilicity of the fabric depends on the woven fibers, the ink will wet the fabric to a greater or lesser extent, and the dimensions obtained will differ from one fabric to another.

To manufacture printed circuits, a support is coated with a copper layer on which a nickel or gold layer is deposited by a chemical or electrochemical process. In this case, the metal layer is deposited on the surface of the support and not in the thickness of the support. This technique is used for nonporous supports on which the copper tracks are obtained by chemical etching.

The manufacture of fabrics defining areas or volumes for metallization or for encapsulation of chemical or biological molecules may be carried out by the process of the invention, by means of a technique derived from screen printing.

Screen printing is a technique widely used in the manufacture of patterns on various supports (clothing, paper). This technique is used to print patterns on a fabric. A pattern is designed on a mesh. A color ink is deposited on the upper surface of the mesh and then scraped through the designed pattern so as to color the material positioned beneath the mesh. The deposited ink covers the surface of the fabric and is incorporated by capillary effect over a certain depth into the mesh cells of the fabric. Document WO 2006/011168 discloses a process for manufacturing silicone-based patterns on the upper part of a stocking so as to create a zone that enables the stocking to grip the legs without another fastening means. This process makes use of the screen printing technique.

SUMMARY

DETAILED DESCRIPTION

Figure 1:
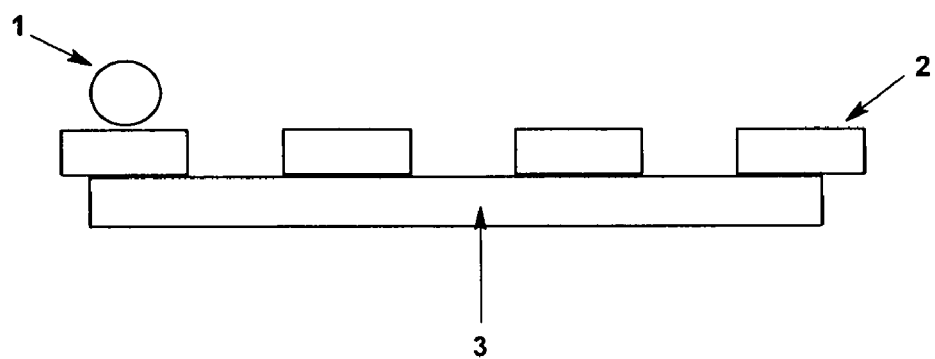
FIG. 1 illustrates a resin positioned on a screen printing mesh.

A first subject of the invention is a process for manufacturing an article comprising an approximately flat porous support and, within this support, defined zones in a chosen pattern, these zones being grafted by sensor molecules, chosen from chemical molecules and biological molecules, whereas the rest of the support remains free of this grafting.

By sensor molecule is meant any molecule that can be used to make a chemical or biological sensor. Ie a molecule that is capable of interacting with the environment in which the porous support on which it is deposited will be introduced. For example, a sensor molecule can be:

A chemical molecule of any kind,

A color indicator which by a color change indicates a change in pH,

A strand of DNA for biological recognition

A protein that can be recognized by enzymes,

RNA.

Among chemical molecules, mention may in particular be made of metal molecules and organic molecules. By metal molecule, one essentially means molecules containing one or more metal atoms, such as notably metals and their alloys, and metal salts and metal derivatives such as metal oxides, the complexes of metal molecules with organic molecules.

This process is notable in that it comprises at least the following steps:

(i) definition of the grafting zones on the porous support;

(ii) application on at least one face of the porous support, by screen printing, of a curable liquid resin on the grafting-excluded zone;

(iii) curing of the resin;

(iv) impregnation of the porous support with a solution or dispersion of sensor molecules;

(v) attachment of the sensor molecules to the support; and (vi) optionally, removal of the resin, for example by dissolution.

The porous support may be based on any type of fiber—natural or synthetic textile fibers, such as for example cotton, flax, polyester, polyamide and acrylic fibers; fibers resulting from the treatment of wood, for example such as cellulose and viscose fibers; mineral fibers such as glass fibers. The porous support may be based on a mixture of fibers. It may also result from mixing one or more types of fibers with other materials, such as for example polymers, especially elastomers, polyethers, polyurethanes, or it may include fillers. The support may be a woven material, a non-woven, or an open-cell foam. Provision may be made for one side of the support to be porous and the other side nonporous, such as for example a fabric fastened to a plastic layer, or a porous silicon deposited on a nonporous silicon.

The definition of the grafting zones is dependent on the intended future use of the grafted porous support and is left to the discretion of the material designer. The zones may be defined using automated means (computer, computer-aided design software) so as to allow data transfer directly to the screen printing equipment, especially for the creation of the mesh.

The screen printing step is performed according to a sequence of operations well known to those skilled in the art: the screen printing mesh defines, by leaving them free, the zones where it is desired to deposit the resin; this mesh is placed on the porous support and that is impregnated with the curable liquid resin.

The resin is forced, by pressing on it, to penetrate into the porous material, by mechanical (pressure) effect combined with the capillary effect, in the free spaces defined by the screen printing mask. This resin may then be cured, for example by exposure to air, by heat treatment or by UV treatment. The screen printing mask defines a resin pattern on the support, this pattern being made up of zones of two types:

A zones, imbibed with resin; and

B zones, located opposite the screen printing mask, which are not affected the resin application and are therefore left free.

The resin may be applied over the entire thickness of the porous support or over a partial thickness. It may also be applied in succession, independently, in complementary or independent patterns on both sides of the support. The screen-printed material may be in the form of one or more layers depending on its viscosity and on the porosity of the support.

The resin is chosen according to its thixotropy: the penetration of the resin into the thickness of the support can be more easily controlled when it is highly thixotropic. High thixotropy also helps in the definition and precision of the pattern transferred onto the support. The nature of the support, and especially its porosity, come into play when choosing the resin.

Among resins that can be used for implementing the invention, mention may for example be made of: inks and varnishes normally used for printing on textiles by screen printing; thixotropic and UV-curable resins, such as AZ4562 resins (from Clariant), NFR15 resins (from JSR Micro) and 1800 series resins (from Shippley); photosensitive resins used in microelectronics; or thixotropic adhesives, such as for example the adhesive Vitralit (from Eleco) and adhesives of the NBA, NEA or NOA series (from Epotecny).

The curing of the resin is controlled so as to harden it and allow the following steps to be carried out, especially step (iv) of impregnating the porous support with a solution or dispersion of sensor molecules, without the resin dissolving on this occasion. Optionally, the resin must also be able to be removed, for example by dissolving it, in step (vi) if it is desired to free the nonfunctionalized zones of the support.

The impregnation of the porous support with a solution or dispersion of sensor molecules, and the attachment of the sensor molecules to the support are carried out by various means depending on the nature of the sensor molecules.

If it is desired to attach metal molecules to the porous support, these two steps may be carried out in the following manner:

To metallize the fabric, this immersion operation may include several successive baths of Pd and Sn solutions, then $CuSO_4$ solutions, followed by successive baths of the chosen metals (Au, Ag, Pt, etc.).

Various methods of metallizing a porous material have been described in the prior art. One method is described by E. Gasana et al. in Surface and Coatings Technology, Vol. 201 (6), 2006, 3547-3551: deposition of polypyrrole on a polyaramid support; activation by immersion in an $SnCl_2$—$PdCl_2$ solution; then activation by chemisorption of palladium or platinum; immersion in a Cu(II) solution; reduction to metallic copper.

This metallization step may also be carried out using the method described by M. Da Costa, in Technologies Internationales, 80, 2002, 25-28: on a polymeric support, treatment with chromic acid and sulfuric acid; reduction of Cr(VI) ions by glyoxal, glyoxylic acid, hydrazine, hydroxylamine, sodium hydrosulfite, sodium bisulfite, tin (II) chloride or a mixture of these products; activation by tin chloride and/or palladium; preimmersion in hydrochloric acid; impregnation with copper.

According to another embodiment, when it is desired to attach nonmetallic molecules to the porous support, steps (iv) and (v) are chemical or biological functionalization steps especially the creation of covalent bonds between the porous support and the molecules to be grafted.

For example, if the support comprises $SiO_2$ functional groups, in the form of a glass fiber woven or integrated beforehand into a nonwoven structure or a foam, steps (iv) and (v) may consist of a silanization, the choice of silane depending on the chemical or biological functional group that it is desired to graft thereafter. A silanization may also be performed on a woven material or a nonwoven or a foam into which glass microbeads have been integrated beforehand.

This silanization then makes it possible to attach biological or chemical elements compatible with the functional groups present on the silane, such as oligonucleotides or proteins.

A silanization may be carried out on supports other than $SiO_2$ supports, such as silicon nitride; certain metal oxides (ITO, i.e. indium tin oxide, and alumina); porous silicon; or composites based on glass or silica fibers.

According to a third embodiment, steps (iv) and (v) may consist of an immersion in a solution or deposition of a solution of a color indicator, adsorbed onto the fibers constituting the support. This color indicator may for example reveal the concentration of a biological or chemical species (ion, molecule, protein, etc.) above a given threshold. This may be a color indicator, the color of which depends on the pH, such as an aqueous solution of Bromothymol Blue, Methyl Yellow, Thymol Blue, Phenol Red, Alizarine Yellow or Methyl Orange, thereby enabling a pH sensor to be produced in a fabric. In this third embodiment, the color indicator is fixed by adsorption onto the fibers of the porous support.

The removal of the resin may be done mechanically (by scratching) or, preferably, it may consist in dissolving the resin in a solvent (alcohol, acetone, acetonitrile, chloroform, toluene, hot water). The choice of solvent depends on the type of resin used.

The articles comprising a porous support functionalized by sensor molecules, made in accordance with the process of the invention are advantageously intended to be used in the presence of a liquid medium, including a body fluid, sensor molecules reacting in response to the detection of a change in their environment. The process of the invention is thus used to make electrochemical batteries. Such a battery integrated into the garment includes at least two electrodes, each consisting of a different conductive material and uses as electrolyte a physiological fluid. Indeed, the sweat, urine, tears or blood can be used as conductive ionic liquid to operate the battery.

EXAMPLES

A) Silanization of a Glass Fiber

1) Resin Screen Printing

Screen printing of a AZ4562 photosensitive resin (from Clariant) through a screen printing mask.

UV curing (at 365 nm) for 2 minutes.

2) Silanization

Various types of silane may be used, each having its own protocol for attachment to the surface of the material to be functionalized. The choice of silane to be used depends on the chemical functional group that it is desired to use, either directly or for subsequently carrying out a chemical reaction or for attachment of a biological element. Among silanes most commonly used, mention may be made of aminopropyltriethoxysilane, aminopropyldimethylethoxy-silane, 5,6-epoxyhexyltriethoxysilane and 2-(hydroxy-ethyl)-3-aminopropyltriethoxysilane.

The silanization protocol used in the case of aminopropyldimethylethoxysilane (in this case there is no need for annealing as no crosslinking possible) is described below:

support: glass fiber;
application of a resin by screen printing
hardening of the resin by UV irradiation;
oxygen plasma treatment (Nextral 310): 150 watts, for 30 seconds so as to create silanol functional groups on the surface of the glass fiber;
incubation in a 1% (v/v) silane/3% (v/v) triethylamine solution in heptane for 12 hours;
rinsing with heptane; and
rinsings with distilled water.

B) Attachment of a Biological Compound (DNA) or a Chemical Functional Group

The silanization technique given above in § A can be used to attach oligonucleotides, proteins or any biological or chemical element compatible with the functional groups (amine, acid, aldehyde, activated ester functional groups, etc.) that are present on the silane attached to the functionalized materials.

The biological entity may be attached directly onto the support by reaction with the functional groups present on the silane (example: reaction between primary amines carried by lysine amino acids and an activated ester functional group present on the support) or else by means of a linker (e.g.: glutaraldehyde).

C) pH Sensor on a Fabric

Support: 90% polyester/10% elastane fabric (weight: 115 $g/m^2 \pm 10\%$)

1) Resin Screen Printing

Screen printing of AZ4562 resin through a screen printing mask defining a zone into which the pH sensor is integrated.

UV curing (at 365 nm) for 2 minutes.

2) Manufacture of the pH Sensor:

preparation of an aqueous bromothymol solution with 50 mg of bromothymol blue and 100 ml of water;
deposition of the aqueous solution on the zone defined by screen printing (2×50 µl);
drying at 65° C. for 10 minutes;
dissolution of the resin in acetone for 1 to 2 minutes;

drying with a nitrogen blower; and test: deposition of a 5 µl droplet of 2M HCl→pink coloration.

D) Determination of a Surface on a Porous Material

FIG. 1

A resin (1) is positioned on a screen printing mesh (2) and the support (3) is positioned beneath the mesh (2).

FIG. 2

After the resin (1) has been spread through the screen printing mesh (2), zones (5) with resin and zones (4) without resin are defined on the support (3).

FIG. 3

After the removal of the mesh, the support has zones (5) with resin delimiting perfectly defined zones (4) without resin.

E) Determination of a Volume on a Porous Material

FIG. 4

A resin (11) is positioned on a screen printing mesh (12) and the support (13) made of porous material is positioned beneath the mesh (12). The volume of the resin (11) or the size of the mesh (12) is designed so that the resin (11) penetrates into the porous material only over part of the thickness of the support (13), and not over the entire thickness.

FIG. 5

After the resin (11) has been spread through the screen printing mesh (12), zones (15) with resin and zones (14) without resin are defined on the support (13).

FIG. 6

Another resin layer is deposited by screen printing on the other side of the support (13) so as to define another zone (16) of defined volume. This second resin layer may be composed of the same resin or a different resin from the first.

F) Functionalization of the Manufactured Zone

FIG. 7

Figure 2:
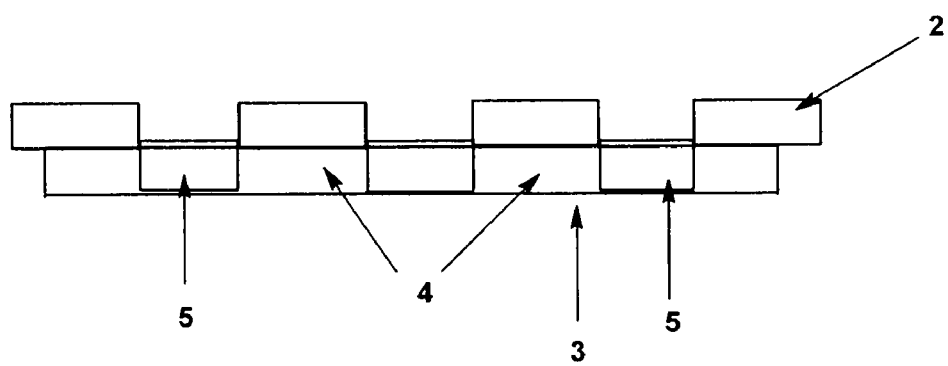
FIG. 2 illustrates zones with and without resin.
Figure 3:
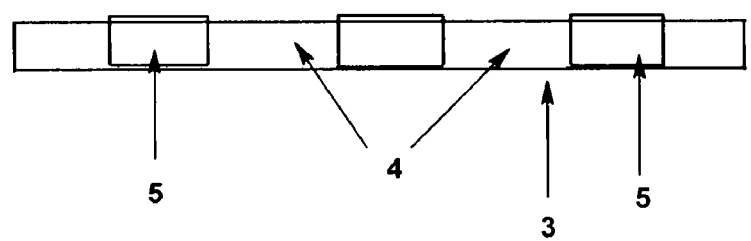
FIG. 3 illustrates removal of the screen printing mesh.
Figure 4:
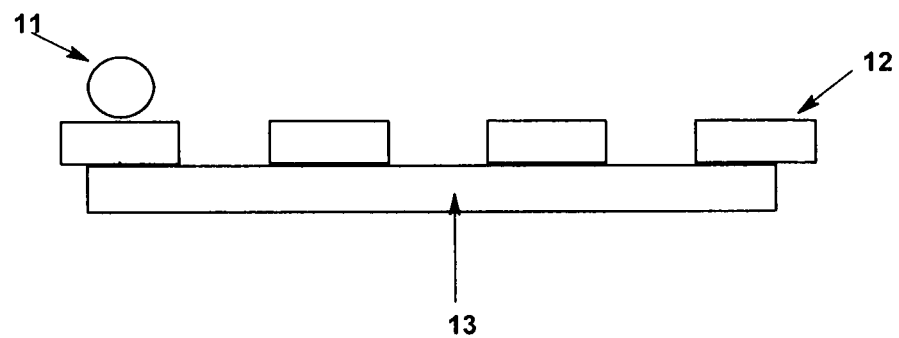
FIG. 4 illustrates a resin positioned on a screen printing mesh.
Figure 5:
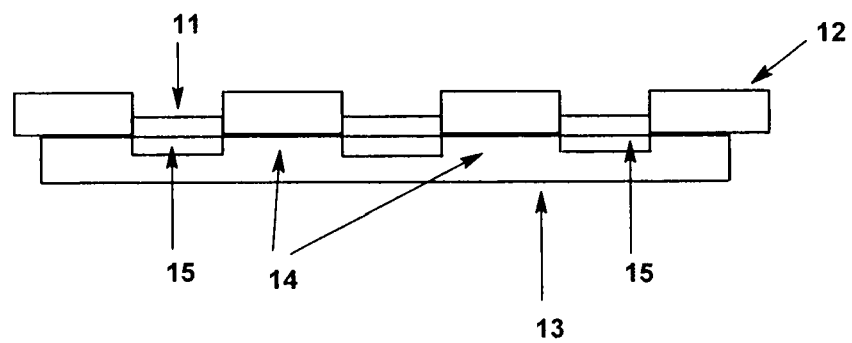
FIG. 5 illustrates zones with in and without resin.
Figure 6:
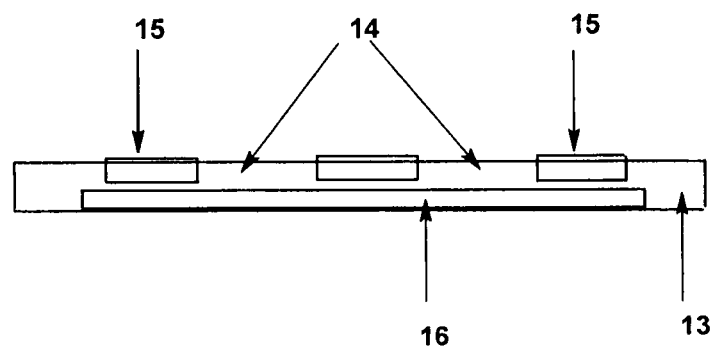
FIG. 6 illustrates deposition of another resin layer.
Figure 7:
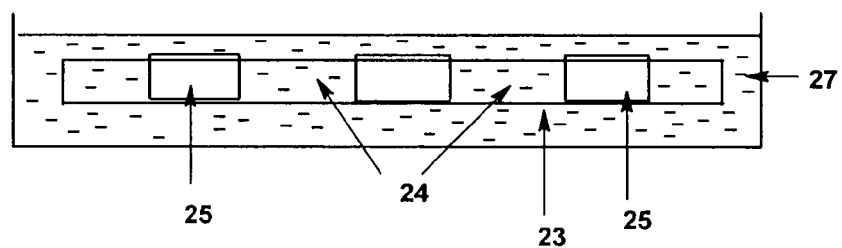
FIG. 7 illustrates a support.
Figure 8:
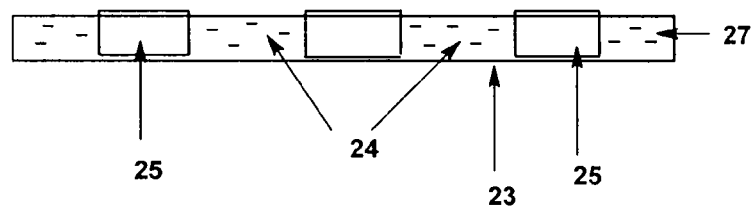
FIG. 8 illustrates removal of the support.
Figure 9:
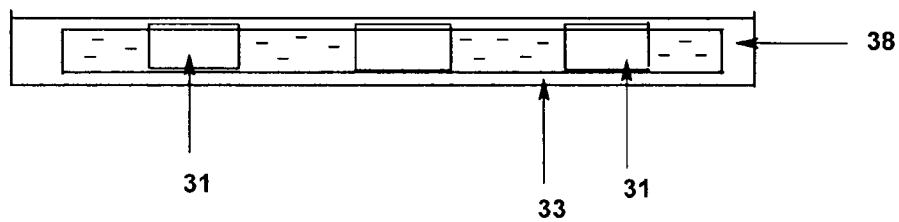
FIG. 9 illustrates immersion of the support in a solution.
Figure 10:
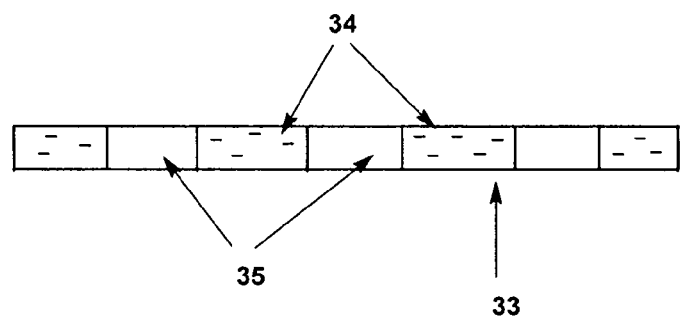
FIG. 10 illustrates the support after resin has been dissolved.

A support (23) identical to that prepared in § D—FIGS. 1 to 3 is used, namely a support (23) comprising resin-impregnated zones (25) and resin-free zones (24). The support (23) is immersed in a bath of a solution (27) containing chemical or biological species to be attached to the support (23).

The solution impregnates the support (23) and in particular penetrates into the resin-free zones (24). This operation may be repeated several times with solutions of different compositions.

FIG. 8

After the chemical or biological species of the solution (27) have been attached, the support (23) is removed from the container.

G) Removal of the Adhesive or Resin

If necessary, and so that the support resumes its properties, it is possible to remove the resin (31) from the support (33).

FIG. 9

The support (33) is immersed in a solution (38) for dissolving the resin (31).

FIG. 10

After the resin (31) has been dissolved, a support (33) is obtained, this support (33) having zones (34) onto which the chemical species have been attached and zones (35) free of chemical species and of resin.

H) Production of Chemical Sensors Intended for Contact with the Skin

We realize by the method described above a deposit of chemical sensor on a textile or other porous support to be put in contact with the skin or a body fluid, for example by being incorporated into a bandage or a fabric.

These include a sensor of (Na+) in sweat. This example describes the use of two electrodes: a first gold electrode and a second gold electrode on which a conductive polymer has been deposited by electrochemical route.

The electrodes were connected to a potentiostat Autolab via a conductive and flexible sheet and immersed into an electrochemical cell containing an electrolytic solution, pyrrole and 4-tert-butylcalix[4]arenetetraacetic acid tetraethylester. The polymer polypyrrole was electrochemically and selectively deposited on three defined electrodes in applying 1.2V during 30 seconds. A dark polymer was obtained.

The Au reference electrode and three electrodes are deposited on the conductive polymer. Thus we have an electroconductive sensor integrated to the textile and to the porous support.

Next, the ability of the sensor to detect a variation of $Na^+$ concentration was evaluated in immersing the fabric in solutions containing increasing and decreasing $Na^+$ concentrations. At each concentration, the OCP (open circuit potential) was measured. We showed that the OCP depends on sodium ions concentration and this potential perfectly follows the variation of this concentration. Thus, excellent reversibility and reproducibility were obtained.

I) Production of Electrochemical Batteries

For the realization of electrochemical batteries, it is possible to deposit by electrolysis using the screen printing process described above different metals on the electrodes when they are metallized. One must then soak the electrode in an electrolytic solution containing the metal ion to be deposited and apply a sufficient electrochemical potential to reduce the metal ion on the surface of the electrode.

The following solutions can be used to obtain a metal deposition on gold electrode:

Solution Siver cy less Technic INC® allows the deposition of a layer of silver on the electrode.

Solution Platinum AP Technic INC® allows you the deposition of a layer of platinum on the electrode Solution of copper sulphate will permi the deposition of a layer of copper on the electrode by electrochemical reduction of copper ion.

A chemical deposition of nickel may also be obtained on the electrodes with a solution of nickel chloride or nickel sulphate.

Then one can consider depositing electrodes of different materials on a fabric or garment and thus make electrochemical batteries.

Such a battery integrated into the garment includes at least two electrodes, each consisting of a different conductive material and uses as electrolyte a physiological fluid. Indeed, the sweat, urine, tears or blood can be used as conductive ionic liquid to operate the battery.

The invention claimed is:

1. A process for manufacturing an article comprising an approximately flat porous support and, within this support, defined grafting zones in a chosen pattern, these grafting zones being grafted by sensor molecules, whereas a rest of the support remains free of this grafting, which process comprises at least the following steps:

(i) defining the grafting zones on the porous support;
(ii) applying, on at least one face of the porous support, by screen printing, a curable liquid resin on a zone different from the grafting zones;
(iii) curing the resin;
(iv) impregnating the porous support with a solution or dispersion of sensor molecules; and
(v) attaching the sensor molecules to the porous support.

2. The process as claimed in claim 1, wherein the porous support is chosen from: a woven material; a non-woven; and an open-cell foam.

3. The process as claimed in claim 1, wherein the sensor molecules are metal molecules.

4. The process as claimed in claim 3, in which step (iv) further comprises immersing the porous support in several successive baths of Pd and Sn solutions, then $CuSO_4$ solutions, followed by successive baths of the sensor molecules which are metal molecules.

5. The process as claimed in claim 3, further comprising:
depositing polypyrrole on the porous support, the porous support being a polyaramid support;
immersing the polyarmid support in an $SnCl_2$—$PdCl_2$ solution;
performing chemisorption of palladium or platinum on the polyarmid support;
immersing the polyarmid support in a Cu(II) solution; and
reducing Cu (II) ion contained in the Cu (II) solution to metallic copper.

6. The process as claimed in claim 3, wherein the porous support is a polymeric support, the process further comprising, during step (iv):

treating the polymeric support with chromic acid and sulfuric acid;
reducing Cr(VI) ions by glyoxal, glyoxylic acid, hydrazine, hydroxylamine, sodium hydrosulfite, sodium bisulfite, tin(II) chloride or a mixture of these products;
activating by tin chloride and/or palladium;
immersing the polymeric support in hydrochloric acid; and
impregnating the polymeric support with copper.

7. The process as claimed in claim 1, wherein the porous support includes $SiO_2$ functional groups, the steps (iv) and (v) include performing a silanization followed by attaching biological or chemical elements compatible with the functional groups.

8. The process as claimed in claim 1, wherein steps (iv) and (v) include immersing the porous support in a solution of a color indicator.

9. The process as claimed in claim 1, further comprising, after step (v), removing the resin.

10. The process as claimed in claim 9, wherein the removing of the resin includes removing the resin by dissolving the resin.

11. The process as claimed in claim 4, wherein the metal molecules are chosen from Au, Ag, and/or Pt molecules.

12. The process of claim 1, wherein steps (iv) and (v) include a step of depositing a solution of a color indicator onto the porous support.

* * * * *